United States Patent
Boyd et al.

(10) Patent No.: US 7,520,284 B2
(45) Date of Patent: Apr. 21, 2009

(54) APPARATUS FOR DEVELOPING PHOTORESIST AND METHOD FOR OPERATING THE SAME

(75) Inventors: John M. Boyd, Hillsboro, OR (US);
Fritz C. Redeker, Fremont, CA (US);
David J. Hemker, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 403 days.

(21) Appl. No.: 11/204,907

(22) Filed: Aug. 15, 2005

(65) Prior Publication Data

US 2006/0269877 A1 Nov. 30, 2006

Related U.S. Application Data (63) Continuation-in-part of application No. 10/261,839, filed on Sep. 30, 2002, now Pat. No. 7,234,477, which is a continuation-in-part of application No. 09/608,244, filed on Jun. 30, 2000, now Pat. No. 6,488,040.

(51) Int. Cl.
*B08B 3/00* (2006.01)
*G03F 7/00* (2006.01)
*F26B 5/12* (2006.01)

(52) U.S. Cl. .............. 134/57 R; 134/95.2; 134/102.3; 134/902; 34/407; 430/326; 430/314

(58) Field of Classification Search .............. 134/56 R, 134/57 R, 58 R, 95.1, 95.2, 95.3, 99.1, 102.3, 134/166 R, 167 R, 198, 902; 34/407; 430/326, 430/313, 314
See application file for complete search history.

(56) References Cited

U.S. PATENT DOCUMENTS

| 6,103,636 | A | * | 8/2000 | Zahorik et al. ............. 438/745 |
| 6,230,722 | B1 | * | 5/2001 | Mitsumori et al. ...... 134/122 R |
| 6,794,300 | B1 | | 9/2004 | Hillman |
| 2004/0182422 | A1 | | 9/2004 | Boyd et al. |

* cited by examiner

*Primary Examiner*—Joseph L Perrin
(74) *Attorney, Agent, or Firm*—Martine Penilla & Gencarella, LLP (57) ABSTRACT

A first proximity head is configured to define a meniscus of a photoresist developer solution on a substrate. The meniscus is to be defined between a bottom of the first proximity head and the substrate. A second proximity head is configured to define a rinsing meniscus on the substrate and remove the rinsing meniscus from the substrate. The second proximity head is positioned to follow the first proximity head relative to a traversal direction of the first and second proximity heads over the substrate. Exposure of the substrate to the meniscus of photoresist developer solution causes previously irradiated photoresist material on the substrate to be developed to render a patterned photoresist layer. The first and second proximity heads enable precise control of a residence time of the photoresist developer solution on the substrate during the development process.

9 Claims, 6 Drawing Sheets

APPARATUS FOR DEVELOPING PHOTORESIST AND METHOD FOR OPERATING THE SAME

CROSS REFERENCE TO RELATED APPLICATIONS

This application is a continuation-in-part of prior application Ser. No. 10/261,839, filed on Sep. 30, 2002, now U.S. Pat. No. 7,234,477, which is a continuation-in-part of prior application Ser. No. 09/608,244, filed on Jun. 30, 2000, U.S. Pat. No. 6,488,040. The aforementioned patent applications are hereby incorporated by reference.

BACKGROUND

During semiconductor fabrication, integrated circuits are created on a semiconductor wafer ("wafer") defined from a material such as silicon. To create the integrated circuits on the wafer, it is necessary to fabricate a large number (e.g., millions) of electronic devices such as resistors, diodes, capacitors, and transistors of various types. Fabrication of the electronic devices involves depositing, removing, and implanting materials at precise locations on the wafer. A process called photolithography is commonly used to facilitate deposition, removal, and implantation of materials at precise locations on the wafer.

In the photolithography process, a photoresist material is first deposited onto the wafer. The photoresist material is then exposed to radiation filtered by a reticle. The reticle is generally a glass plate that is patterned with exemplary feature geometries that block some of the radiation from passing through the reticle. After passing through the reticle, the radiation contacts the surface of the photoresist material and changes the chemical composition of the exposed photoresist material. With a positive photoresist material, exposure to the radiation causes the exposed photoresist material to become more soluble in a developing solution. Conversely, with a negative photoresist material, exposure to the radiation causes the exposed photoresist material to become less soluble in the developing solution.

Following exposure to the radiation, the photoresist material is subjected to a developing process. In the developing process, the photoresist material is exposed to the developing solution to dissolve portions of the photoresist material that have been made more soluble by exposure to the radiation. Thus, the more soluble portions of the photoresist material are removed by dissolution in the developing solution, leaving a patterned photoresist layer. It should be appreciated that with sufficient exposure to the developing solution, eventually even portions of the photoresist material that have not been made more soluble by irradiation may partially dissolve in the developing solution. Therefore, it is necessary to control a residence time of the developing solution on the photoresist material such that only portions of the photoresist material that have been modified by irradiation are removed.

Once the photoresist material has been developed to reveal the patterned photoresist layer, the wafer is processed to remove, deposit, or implant materials in the wafer regions not covered by the patterned photoresist layer. Therefore, it should be appreciated that if the patterned photoresist layer is not accurately defined, the wafer regions not covered by the patterned photoresist layer will not be accurately defined, and the subsequent wafer processing using the patterned photoresist layer will be inaccurate. Thus, it is necessary to control the residence time of the developing solution on the wafer to ensure that appropriate portions of the photoresist material are removed during the developing process to provide for an accurately defined patterned photoresist layer.

SUMMARY

In one embodiment, an apparatus is disclosed for developing an exposed photoresist material on a substrate. The apparatus includes a first proximity head configured to define a meniscus of a photoresist developer solution on the substrate. The meniscus is to be defined between a bottom of the first proximity head and the substrate. The apparatus further includes a second proximity head configured to define a rinsing meniscus on the substrate and remove the rinsing meniscus from the substrate. The second proximity head is positioned to follow the first proximity head relative to a traversal direction of the first and second proximity heads over the substrate.

In another embodiment, a system is disclosed for developing an exposed photoresist material on a substrate. The system includes a first proximity head configured to define a meniscus of a photoresist developer solution on the substrate. The system also includes a second proximity head defined to rinse and dry the substrate. The second proximity head is positioned to follow the first proximity head relative to a traversal direction of the first and second proximity heads over the substrate. The system further includes a proximity head positioning device defined to maintain a separation distance between the first and second proximity heads. Additionally, the system includes a proximity head positioning device controller defined to control the separation distance between the first and second proximity heads. The separation distance between the first and second proximity heads is controlled to establish a desired photoresist developer solution residence time on the substrate.

In another embodiment, an apparatus is disclosed for developing an exposed photoresist material on a substrate. The apparatus includes a proximity head configured to define a meniscus of photoresist developer solution on the substrate. The proximity head is configured to define the meniscus between a bottom of the proximity head and the substrate. The proximity head is further configured to substantially remove the disposed meniscus of photoresist developer solution from the substrate.

In another embodiment, a method is disclosed for controlling photoresist developer residence time on a substrate. The method includes defining a meniscus of a photoresist developer solution on the substrate. The defined meniscus of photoresist developer solution is then traversed over the substrate. The method further provides for controlling a residence time of the photoresist developer solution on the substrate. The residence time represents a duration that a given location on the substrate is exposed to the meniscus of photoresist developer solution.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
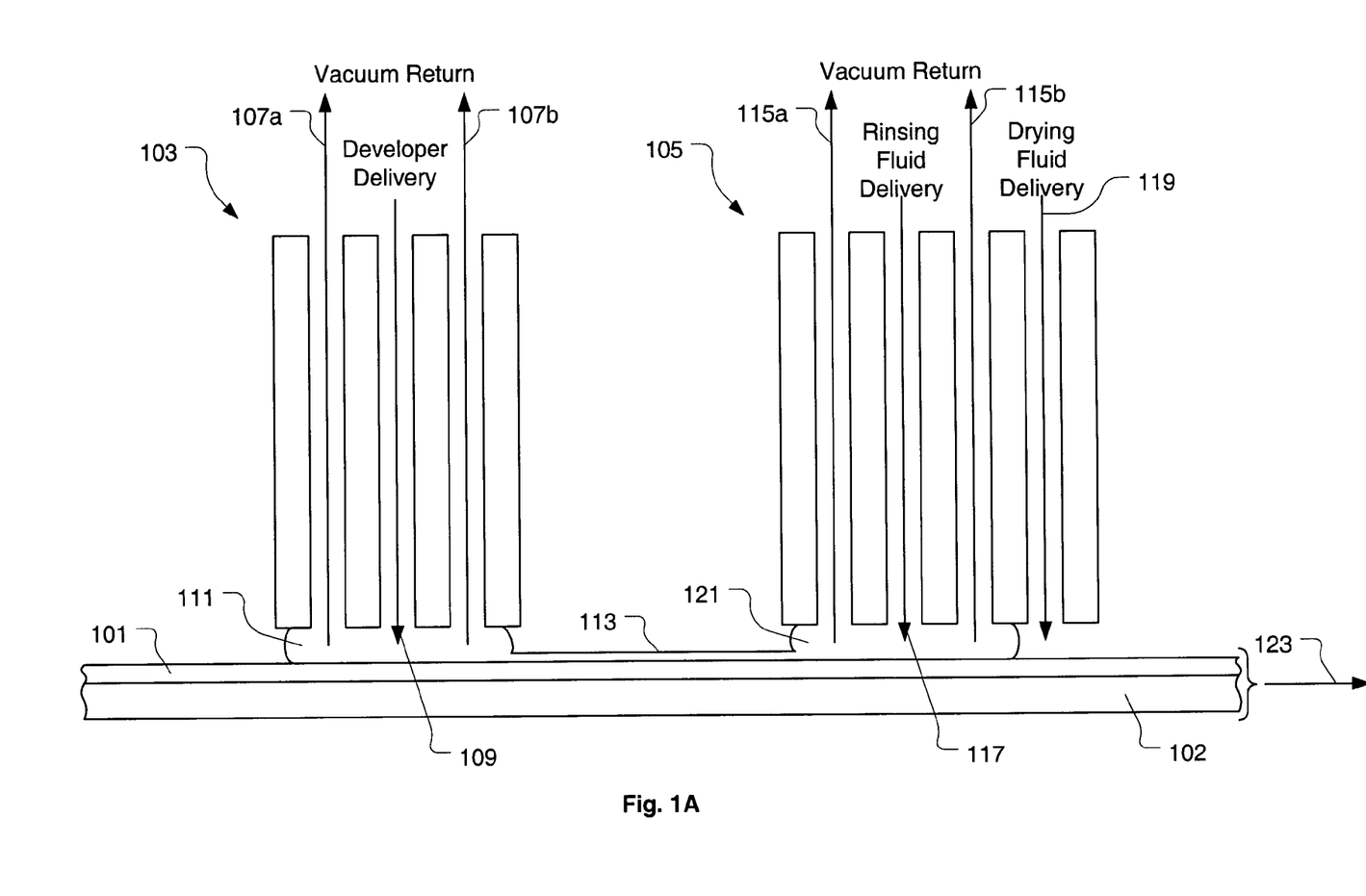
FIG. 1A is an illustration showing an apparatus for developing an exposed photoresist material on a substrate, in accordance with one embodiment of the present invention.

FIG. 1A is an illustration showing an apparatus for developing an exposed photoresist material on a substrate 101, in accordance with one embodiment of the present invention. The substrate 101 can be a semiconductor wafer, a liquid crystal display panel, or any other type of substrate upon which a photolithography process is performed to define features, e.g., circuits, thereon. The substrate 101 as depicted in FIG. 1A includes a top layer of photoresist material, wherein the photoresist material has been exposed to a patterned radiation source. For example, in one embodiment, the substrate 101 represents a semiconductor wafer upon which a photoresist material layer has been deposited and exposed in a stepping operation. In the stepping operation, regions of the photoresist material layer are exposed to ultraviolet (UV) light filtered through a reticle defining a mask pattern.

For the present invention, the photoresist material can be either a positive photoresist or a negative photoresist. In the case of the positive photoresist, the photoresist material responds to the incident radiation, e.g., UV light, by becoming more soluble in the presence of a developing solution. Thus, with the positive photoresist, the pattern formed in the photoresist material layer following the development process is equivalent to the mask pattern defined by the reticle through which the radiation is filtered. In the case of the negative photoresist, the photoresist material responds to the incident radiation, e.g., UV light, by becoming less soluble in the presence of the developing solution. Thus, with the negative photoresist, the pattern formed in the photoresist material layer following the development process is equivalent to the reverse of the mask pattern defined by the reticle through which the radiation is filtered. The present invention is associated with the photoresist development process and is equally applicable to both positive and negative photoresist materials.

With respect to FIG. 1A, the apparatus includes a first proximity head 103, a second proximity head 105, and a conveyance device 102. During the development process, the substrate 101 rests in a fixed manner on the conveyance device 102. The conveyance device 102 functions to move the substrate 101 in a linear direction beneath the first and second proximity heads 103 and 105, respectively, as indicated by arrow 123. Additionally, the conveyance device 102 is defined to maintain a substantially uniform distance between the top of the substrate 101 and the bottom of the first and second proximity heads 103/105, as the substrate 101 traverses beneath the first and second proximity heads 103/105. It should be appreciated that in various embodiments the conveyance device 102 can be defined as a table, a belt, or any other type of device capable of supporting the substrate 101 and moving the substrate in a linear manner beneath the first and second proximity heads 103/105.

The first proximity head 103 is configured to define a meniscus 111 of a photoresist developer solution on the substrate 101, as the substrate 101 passes beneath the first proximity head 103. As depicted in FIG. 1A, the meniscus 111 of photoresist developer solution is to be defined within a region present between the bottom of the first proximity head 103 and the substrate 101. The first proximity head 103 includes a developer delivery channel to enable provision of the photoresist developer solution to the meniscus 111, as indicated by arrow 109. Additionally, the first proximity head 103 includes first and second vacuum return channels, as indicated by respective arrows 107a and 107b, to support definition and confinement of the meniscus 111 of photoresist developer solution on the substrate 101 beneath the first proximity head 103. The vacuum return channels 107a/107b are operated to confine a bulk of the meniscus 111 beneath the first proximity head 103. However, as the substrate 101 moves past the first proximity head 103 in the direction 123, a thin film 113 of photoresist developer solution remains on the substrate 101.

The second proximity head 105 is configured to define a rinsing meniscus 121 on the substrate 101, remove the rinsing meniscus 121 from the substrate 101, and dry the substrate 101. Thus, the second proximity head 105 is positioned to follow the first proximity head 103 relative to a traversal direction of the first and second proximity heads 103/105 over the substrate 101, as the substrate 101 moves in the direction 123. The second proximity head 105 includes a rinsing fluid delivery channel to enable provision of the rinsing meniscus 121, as indicated by arrow 117. The second proximity head 105 also includes first and second vacuum return channels, as indicated by respective arrows 115a and 115b, to support definition and confinement of the rinsing meniscus 121 on the substrate 101 beneath the second proximity head 105. Additionally, the second proximity head 105 includes a drying fluid delivery channel to enable provision of the drying fluid to the substrate 101, as indicated by arrow 119, immediately following removal of the rinsing fluid through the vacuum channel 115b. Thus, as the substrate 101 emerges from beneath the second proximity head 105, a patterned photoresist layer having been rinsed and dried is present on the substrate 101.

It should be appreciated that the photoresist developer solution present within both the meniscus 111 and the thin film 113 functions to dissolve portions of the photoresist material present on the substrate 101, wherein the portions of photoresist material that have been made more soluble through the previous irradiation process are more rapidly dissolved. Accurate developing of the patterned photoresist layer is dependent on ensuring that the residence time of the developer solution on the photoresist material is appropriate to remove the irradiated portion of photoresist material without adversely removing non-irradiated portions of the photoresist material. With the apparatus of FIG. 1A, the residence time of the developer solution on the substrate 101 is defined by the duration over which both the meniscus 111 and the thin film 113 of developer solution is present on the substrate 101. Therefore, considering a particular substrate movement velocity in the direction 123, the positioning of the first and second proximity heads 103/105 is configured to set a desired residence time for the photoresist developer solution on the substrate 101.

It should be appreciated that the apparatus of FIG. 1A, as previously described, is capable of being operated using any suitable photoresist developer solution, any suitable rinsing fluid, and any suitable drying fluid. In exemplary embodiments, the photoresist developer solution is TMAH (tetramethylammoniumhydroxide), the rinsing fluid is deionized water, and the drying fluid is a gas mixture including isopropyl alcohol vapor.

Figure 1B:
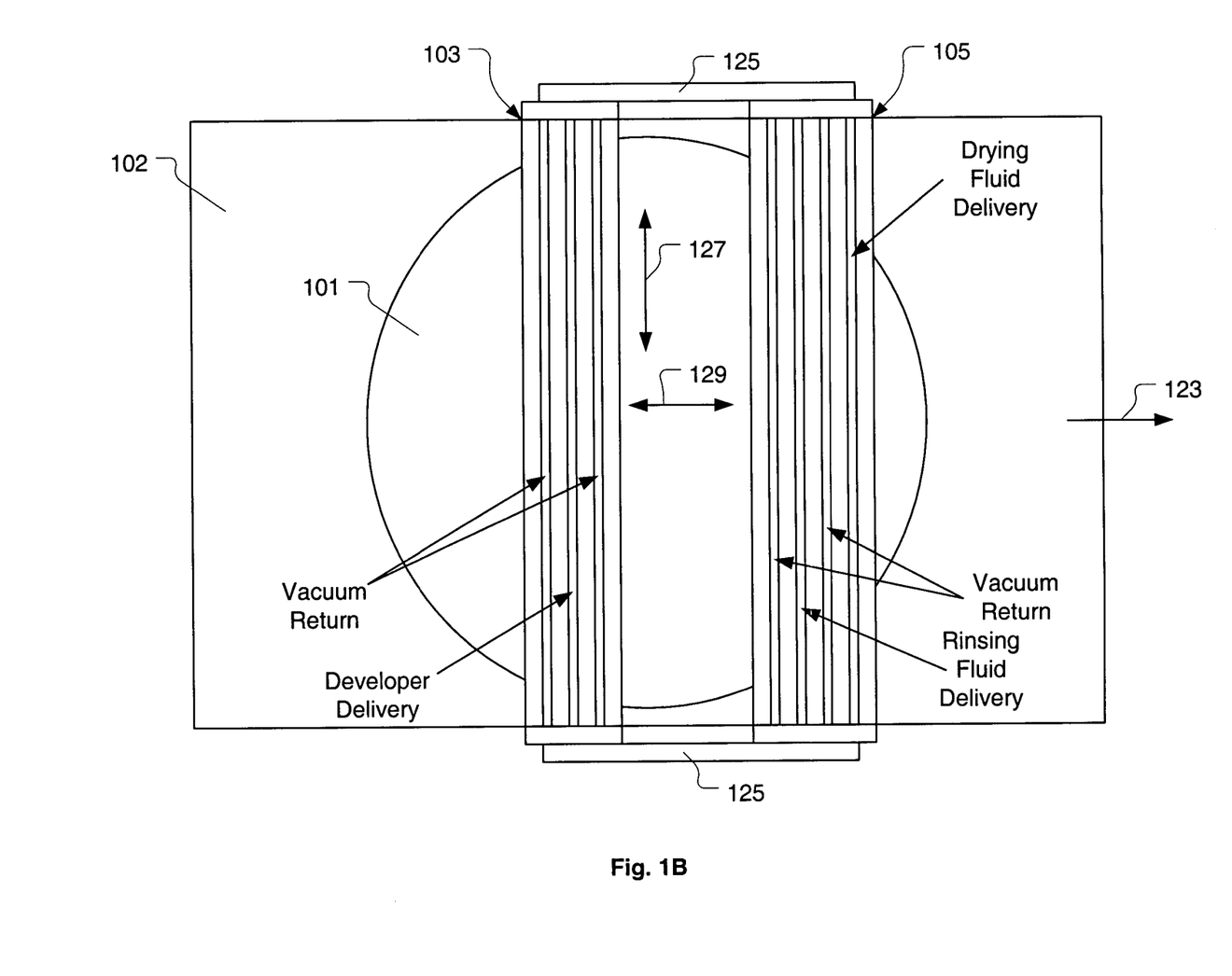
FIG. 1B is an illustration showing a top view of the apparatus of FIG. 1A, in accordance with one embodiment of the present invention.

FIG. 1B is an illustration showing a top view of the apparatus of FIG. 1A, in accordance with one embodiment of the present invention. As previously discussed with respect to FIG. 1A, the substrate 101 is supported by the conveyance device 102, which is configured to be moved in the linear direction 123 beneath the first and second proximity heads 103/105. In the exemplary embodiment of FIG. 1B, the first and second proximity heads 103/105 are configured in a rectangular, bar-like manner. More specifically, an extent of each of the first and second proximity heads 103/105 in a first direction 127 is at least a diameter of the substrate 101. Also, an extent of each of the first and second proximity heads 103/105 in a second direction 129 is less than the extent in the first direction, wherein the second direction 129 is perpendicular to the first direction 127. Therefore, as the substrate moves beneath the first and second proximity heads 103/105 in the direction 123, the meniscus 111 and thin film 113 of photoresist developer solution traverses over the substrate 101 in a linear manner coincident with the second direction 129.

FIG. 1B also shows a proximity head positioning device 125 defined to control a separation distance between the first proximity head 103 and the second proximity head 105. In one embodiment, the proximity head positioning device 125 includes a first structure connecting the first and second proximity heads 103/105 at one end, and a second structure connecting the first and second proximity heads 103/105 at the other end. The structures of the proximity head position device 125 are defined to enable adjustment of the separation distance between the first and second proximity heads 103/105. In another embodiment, the proximity head positioning device is defined by a single structure extending between the first and second proximity heads 103/105. It should be appreciated that in various embodiments the proximity head positioning device can be defined in different ways and incorporate different mechanical features, e.g., chains, gears, motors, belts, etc., so long as the proximity head positioning device is capable of maintaining a desired separation distance between the first and second proximity heads 103/105. Additionally, the proximity head positioning device provides for a substantially uniform separation distance between the first and second proximity heads 103/105 in the first direction 127. Furthermore, the proximity head positioning device preferably enables either manual or automatic adjustment of the separation distance between the first and second proximity heads 103/105.

Figure 2A:
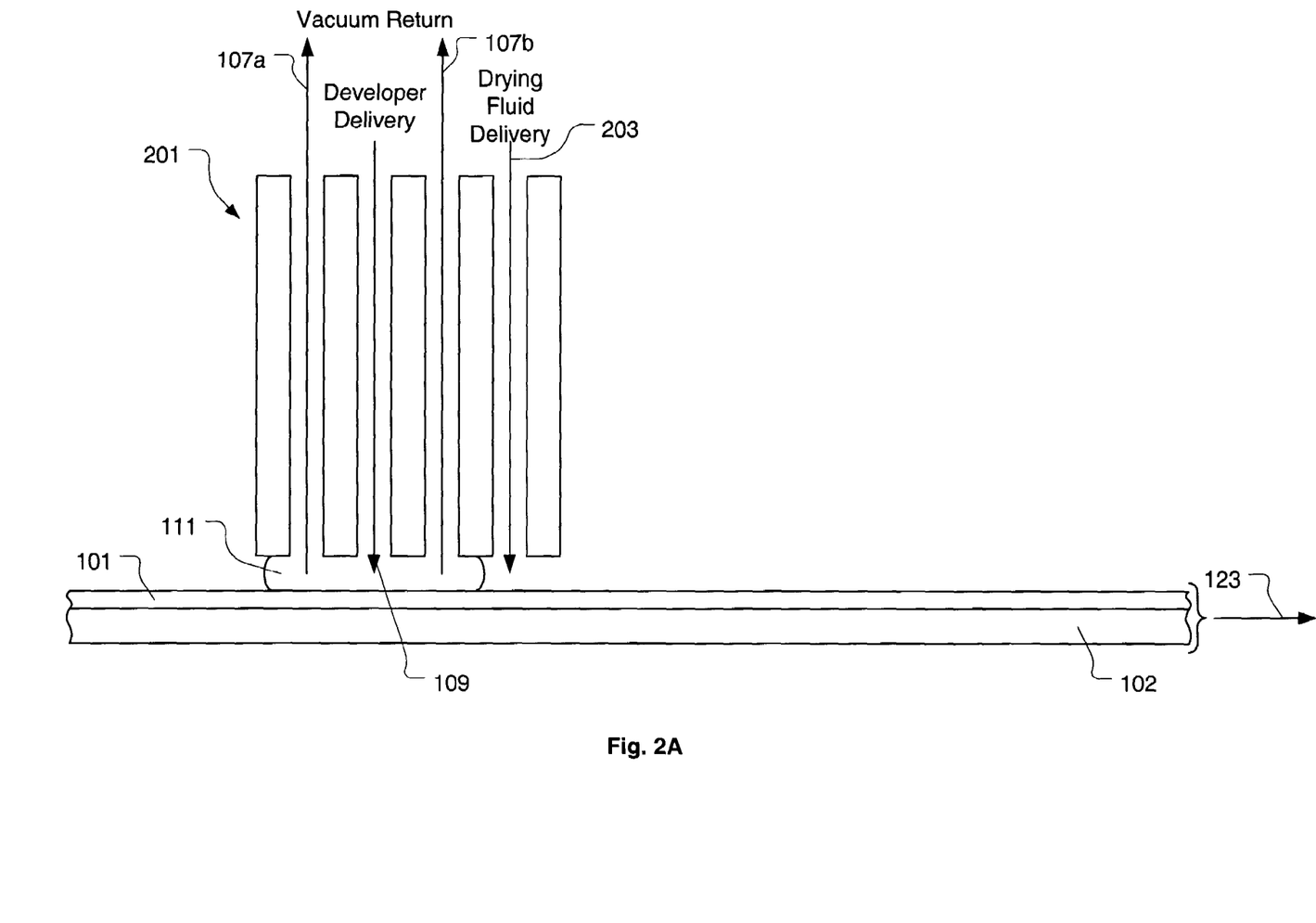
FIG. 2A is an illustration showing an apparatus for developing an exposed photoresist material on a substrate, in accordance with another embodiment of the present invention.

FIG. 2A is an illustration showing an apparatus for developing an exposed photoresist material on a substrate, in accordance with another embodiment of the present invention. As with the apparatus of FIGS. 1A-1B, the apparatus of FIG. 2A shows the substrate 101 supported by the conveyance device 102, wherein the conveyance device 102 is defined to linearly move the substrate 101 in the direction 123. The apparatus of FIG. 2A also includes a proximity head 201 configured to define the meniscus 111 of photoresist developer solution on the substrate 101. Similar to the first proximity head 103 of FIG. 1A, the proximity head 201 of FIG. 2A includes the developer delivery channel to enable provision of the photoresist developer solution to the meniscus 111, as indicated by arrow 109. Additionally, the proximity head 201 includes first and second vacuum return channels, as indicated by respective arrows 107a and 107b, to support definition and confinement of the meniscus 111 of photoresist developer solution on the substrate 101 beneath the proximity head 201. The proximity head 201 further includes a drying fluid delivery channel to enable provision of a drying fluid to the substrate 101, as indicated by arrow 203. The drying fluid is applied to the substrate 101 immediately following removal of the photoresist developer solution through the vacuum channel 107b. Thus, as the substrate 101 emerges from beneath the proximity head 201, a patterned photoresist layer is present on the substrate 101.

With the apparatus of FIG. 2A, the residence time of the photoresist developer solution at a particular location on the substrate 101 is equivalent to the time that the meniscus 111 of photoresist developer solution is in contact with the particular location. Thus, the residence time of the photoresist developer solution at a particular location on the substrate 101 can be set by controlling the relative velocity of the substrate 101 with respect to the proximity head 201. It should be appreciated that in the apparatus of FIG. 2A, the meniscus 111 of photoresist developer solution is used to both dissolve the appropriate portions of photoresist material and substantially remove the dissolved photoresist materials from the substrate 101.

Following the meniscus 111 of photoresist developer solution with immediate exposure to the drying fluid may leave a dry residue of photoresist developing solution on the substrate 101. Some wafer fabrication processes may not be adversely affected by the presence of the dry residue of photoresist developing solution on the resulting patterned photoresist layer. Therefore, with such wafer fabrication processes, the irradiated photoresist material can be developed using the apparatus of FIG. 2A without incurring the process overhead associated with a separate rinsing and drying operation. However, if the wafer fabrication process that will ultimately use the patterned photoresist layer is sensitive to the dry residue of photoresist developing solution, a subsequent rinse and dry operation can be performed using the apparatus of FIG. 2B.

Figure 2B:
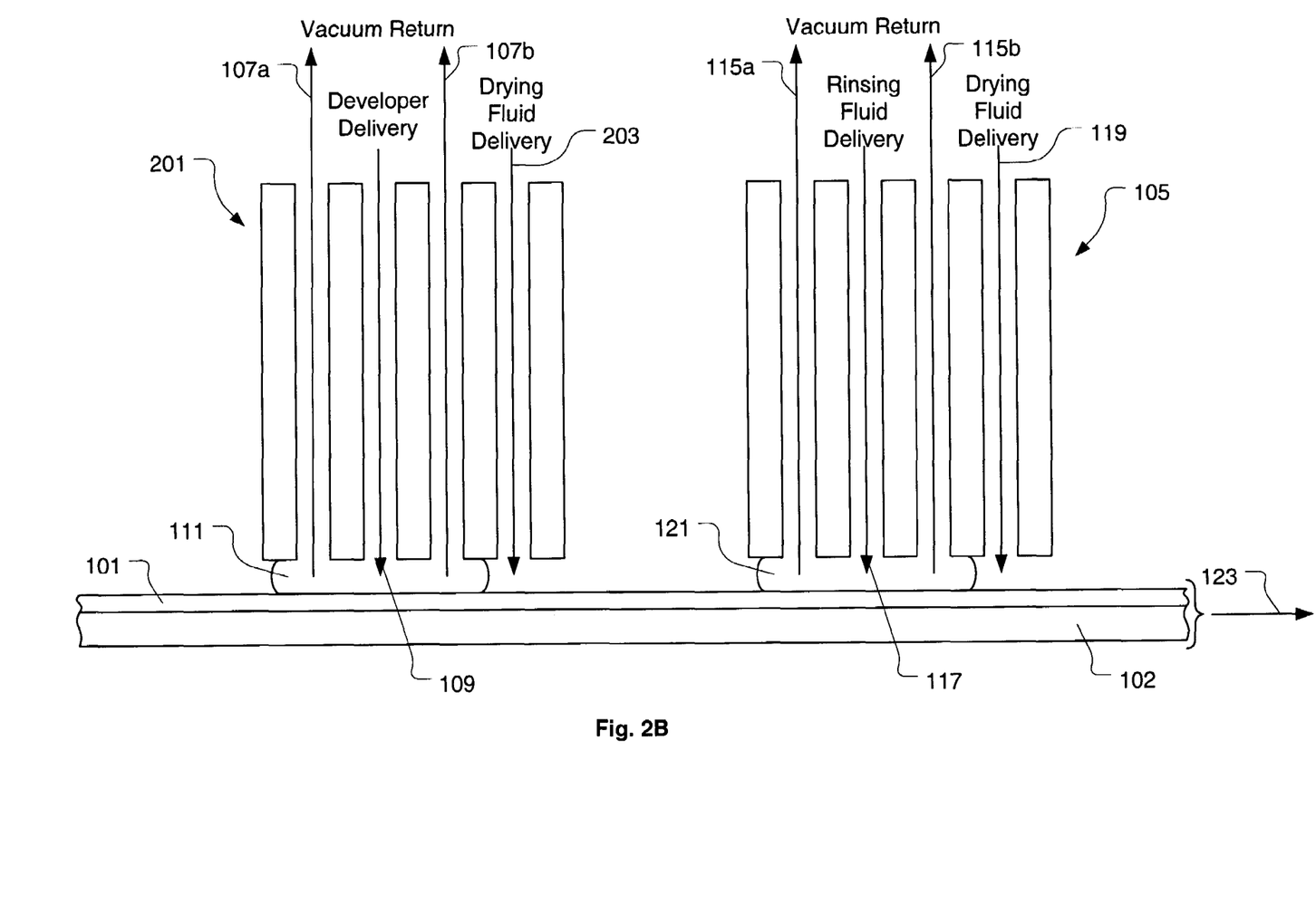
FIG. 2B is an illustration showing the apparatus of FIG. 2A incorporating a rinse and dry operation, in accordance with one embodiment of the present invention.

FIG. 2B is an illustration showing the apparatus of FIG. 2A incorporating a rinse and dry operation, in accordance with one embodiment of the present invention. The apparatus includes the proximity head 210 of FIG. 2A. In addition, the apparatus of FIG. 2B includes the second proximity head 105, as previously described with respect to FIGS. 1A and 1B. The second proximity head 105 is configured to dispose a rinsing fluid on the substrate 101 through the rinsing fluid delivery channel, as indicated by arrow 117. The second proximity head 105 is also configured to remove the disposed rinsing fluid from the substrate 101 through the vacuum return channels, as indicated by arrows 115a and 115b. As previously discussed with respect to FIG. 1A, the rinsing fluid delivery channel and the vacuum return channels work together to define and confine the rinsing meniscus 121 beneath the second proximity head 105. Additionally, the substrate 101 is dried through application of the drying fluid, as indicated by arrow 119.

Although the apparatus of FIG. 2B includes the proximity head 201 and the second proximity head 105, the residence time of the photoresist developer solution on the substrate 101 is set by controlling the relative velocity of the substrate 101 with respect to the proximity head 201. Therefore, in contrast to the embodiment of FIG. 1A, the drying fluid delivery through the proximity head 201 prevents the thin film 113 of photoresist developer solution from forming on the substrate 101. Thus, in the embodiment of FIG. 2B, the separation distance between the proximity head 201 and the second proximity head 105 does not affect the residence time of the photoresist developer solution on the substrate 101.

Figure 3:
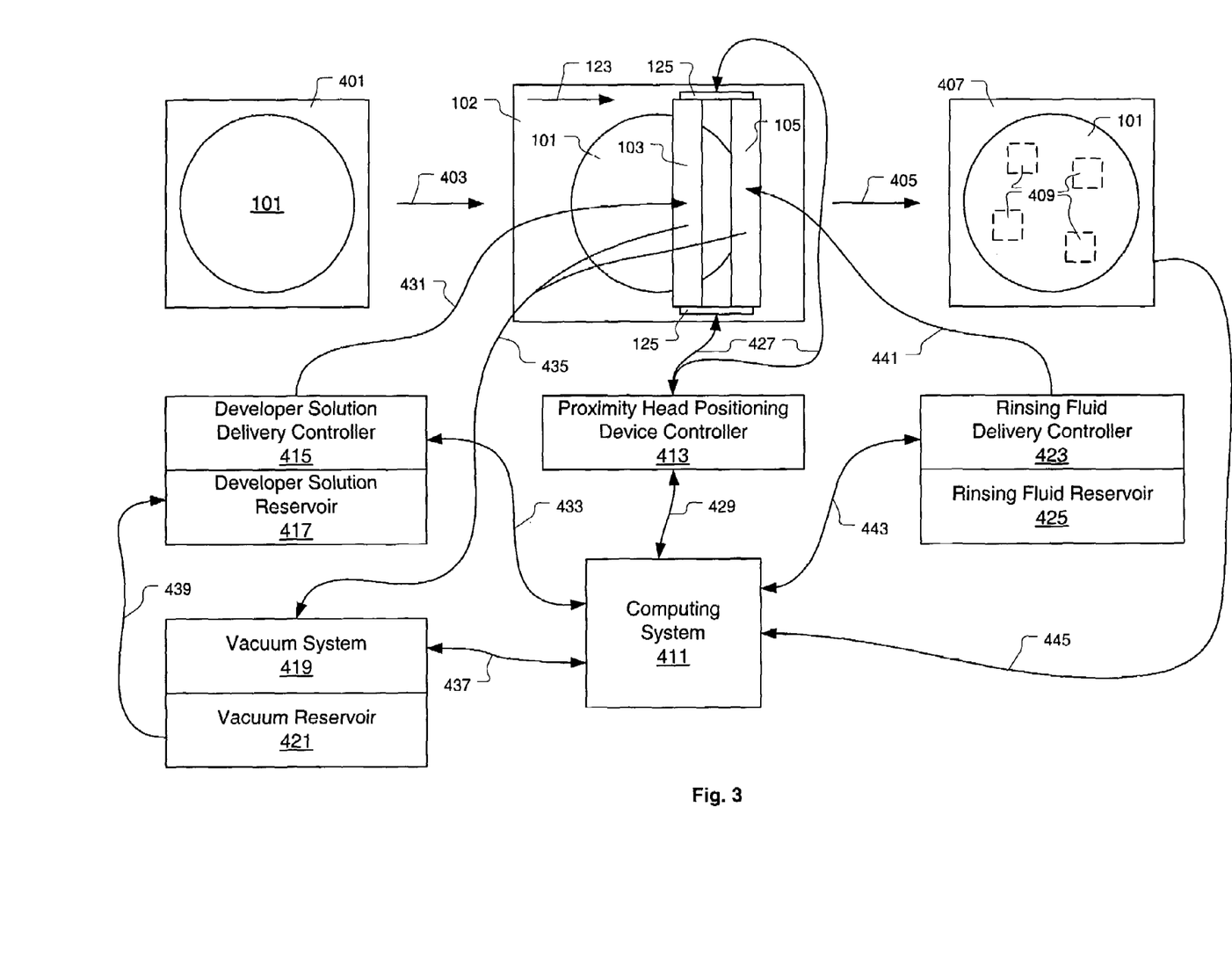
FIG. 3 is an illustration showing a system for developing an exposed photoresist material on a substrate, in accordance with one embodiment of the present invention.

FIG. 3 is an illustration showing a system for developing an exposed photoresist material on a substrate, in accordance with one embodiment of the present invention. The system incorporates the photoresist developing apparatus as previously described with respect to FIGS. 1A and 1B. Therefore, FIG. 3 shows the substrate 101 supported by the conveyance device 102, wherein the conveyance device 102 is defined to move the substrate in the direction 123 beneath the first and second proximity heads 103/105. The proximity head positioning device 125 is also depicted as being configured to control the separation distance between the first and second proximity heads 103/105.

Prior to being subjected to the development process, the substrate 101 having the photoresist material layer deposited thereon is irradiated in a stepper 401. In one embodiment, the stepper 401 functions to expose each die on the substrate 101 to a patterned radiation source such a UV light. The radiation chemically modifies the photoresist material to effect its solubility in the developing solution. It should be understood, however, that the system of FIG. 3 is not limited to having the substrate 101 processed in a stepper 401. For example, the substrate 101 can be irradiated in any manner and in any type of device that is capable of modifying the photoresist material characteristics as appropriate for the subsequent photoresist developing process. Once the photoresist material is appropriately irradiated, the substrate 101 is transferred to the photoresist developing apparatus, as indicated by arrow 403.

As previously described with respect to FIGS. 1A-1B, as the substrate 101 traverses beneath the first and second proximity heads 103/105, the substrate 101 is exposed to the meniscus and trailing thin film layer of photoresist developer solution. With a positive photoresist, the photoresist developer solution functions to dissolve portions of the photoresist material that have been made more soluble by the previous irradiation. Thus, as the substrate 101 emerges from beneath the second proximity head 105 a patterned photoresist layer exists on the substrate 101. The substrate 101 is then transferred to a substrate examination device 407, as indicated by arrow 405. The substrate examination device 407 is defined to characterize a condition of the substrate 101 following traversal of the substrate beneath the first and second proximity heads 103/105. For example, the substrate examination device can examine portions 409 of the patterned photoresist layer on the substrate to ensure that the photoresist development process has been performed accurately. In one embodiment, the substrate examination device 407 is a scanning electron microscope (SEM) and the examination includes capturing and inspecting SEM images of the portions 409 of the patterned photoresist layer. The characterization data obtained from the substrate examination is passed from the substrate examination device 407 to a computing system 411, as indicated by arrow 445.

The computing system 411 is defined to communicate instructions to a proximity head positioning device controller 413, as indicated by arrow 429. The proximity head positioning device controller 413 is defined to control the separation distance between the first and second proximity heads 103/105 to establish a desired photoresist developer solution residence time on the substrate 101. Thus, the proximity head positioning device controller 413 communicates control instructions to the proximity head positioning device 125, as indicated by arrows 427. If the characterization data obtained from the substrate examination indicates that the photoresist is being underdeveloped, the computing system can instruct the photoresist head positioning device controller 413 to increase the separation between the first and second proximity heads 103/105 to increase the residence time of the photoresist developer solution on the substrate 101. Conversely, if the results obtained from the substrate examination indicate that the photoresist is being overdeveloped, the computing system can instruct the photoresist head positioning device controller 413 to decrease the separation between the first and second proximity heads 103/105 to decrease the residence time of the photoresist developer solution on the substrate 101. It should be appreciated that the proximity head positioning device controller 413 can be configured to automatically adjust the separation between the first and second proximity heads 103/105 based on the substrate 101 characterization data, as received by the computing system 411 from the substrate examination device 407.

The computing system 411 is also defined to communicate instructions to a developer solution delivery controller 415, as indicated by arrow 433. The developer solution delivery controller 415 is defined to regulate a flow rate of the photoresist developer solution from a developer solution reservoir 417 to the first proximity head 103, as indicated by arrow 431, based on instructions received from the computing system 411. The instructions received by the developer solution delivery controller 415 may be based on substrate 101 characterization data provided by the substrate examination device 407. For example, if the photoresist is being underdeveloped, the computing system 411 call instruct the developer solution delivery controller to increase the flow rate of the developer solution through the first proximity head 103.

In one embodiment, the photoresist developer solution is reclaimed following exposure to the substrate. In this embodiment, the photoresist developer solution is supplied to the meniscus with a flow rate within a range extending from about 400 mL/min to about 2 L/min. In another embodiment, the used photoresist developer solution is discarded as a process consumable. In this embodiment, just enough photoresist developer solution is supplied to form and maintain the meniscus under the entirety of the first proximity head 103. This embodiment is characterized as a low-flow pooling method.

The computing system 411 is also defined to communicate instructions to a vacuum system 419, as indicated by arrow 437. The vacuum system 419 operates to provide the necessary vacuum to the first and second proximity heads 103/105, as indicated by arrow 435. The vacuum system 419 disposes the vacuumed materials into a vacuum reservoir 421. As mentioned above, an embodiment exists in which the photoresist developer solution is reclaimed from the vacuum reservoir and placed back into the developer solution reservoir 417, as indicated by arrow 439. Because definition and confinement of both the meniscus of photoresist developer solution beneath the first proximity head 103 and the rinsing meniscus under the second proximity head 105 are affected by the vacuum strength, the computing system 411 can adjust each meniscus by communicating appropriate vacuum control instructions to the vacuum system 419.

The computing system 411 is also defined to communicate instructions to a rinsing fluid delivery controller 423, as indicated by arrow 443. The rinsing fluid delivery controller is defined to regulate a flow rate of the rinsing fluid to the second proximity head 105, as indicated by arrow 441, based on instructions received from the computing system 411. The rinsing fluid control instructions received from the computing system 411 can be based on the substrate characterization data received from the substrate examination device 407. For example, if the substrate characterization data indicates that an excessive amount of photoresist developer solution residue is being left on the substrate 101, the computing system 411 can instruct the rinsing fluid delivery controller 423 to increase the flow rate of rinsing fluid to the second proximity head 105.

Figure 4:
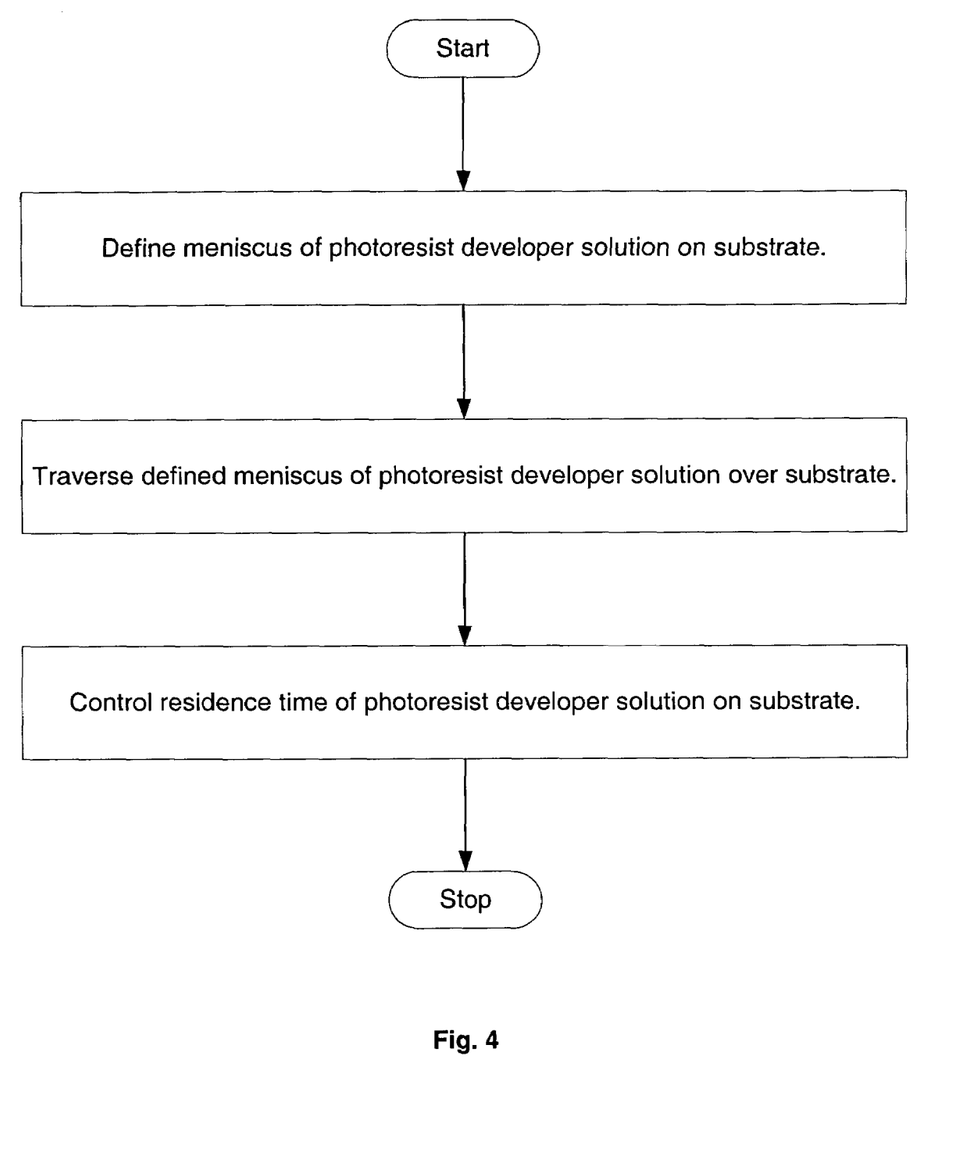
FIG. 4 is an illustration showing a method for controlling photoresist developer residence time on a substrate, in accordance with one embodiment of the present invention.

FIG. 4 is an illustration showing a method for controlling photoresist developer residence time on a substrate, in accordance with one embodiment of the present invention. The method includes an operation 501 for defining a meniscus of a photoresist developer solution on the substrate. In one embodiment, the meniscus is defined to cover an area having an extent in a first direction that is at least a diameter of the substrate. In this same embodiment, the meniscus is defined to have an extent in a second direction that is less that the extent in the first direction, wherein the second direction is perpendicular to the first direction. The method also includes an operation 503 for traversing the defined meniscus of photoresist developer solution over the substrate. In one embodiment, the meniscus is traversed over the substrate such that the entire substrate is exposed to the meniscus in one pass of the meniscus over the substrate. Therefore, with respect to the above embodiment in which the meniscus is defined to cover an area extending in the first and second directions, the meniscus is traversed over the substrate in a linear manner coincident with the second direction. It should be appreciated that traversal of the meniscus of photoresist developer solution over the substrate can be accomplished by moving the substrate beneath a stationary meniscus of photoresist developer solution.

The method further includes an operation 505 for controlling a residence time of the photoresist developer solution on the substrate. The residence time represents a duration that a given location on the substrate is exposed to the photoresist developer solution. In one embodiment, controlling the residence time of the photoresist developer solution includes controlling a relative velocity between the defined meniscus of photoresist developer solution and the substrate. This embodiment assumes that the meniscus of photoresist developer solution is confined in a substantially complete manner such that an amount of photoresist developer solution present on the substrate following traversal of the meniscus thereover is not sufficient to cause continued development of the photoresist material. An alternative variation of this embodiment can include disposal of a drying fluid, such as an isopropyl alcohol vapor mixture, on portions of the substrate immediately following traversal of the meniscus of photoresist developer solution thereover.

In another embodiment, controlling the residence time of the photoresist developer solution includes controlling a separation distance between the meniscus of photoresist developer solution and a meniscus of rinsing fluid defined to follow the meniscus of photoresist developer solution across the substrate. In this embodiment, a thin film of photoresist developer solution is allowed to remain on the substrate following traversal of the meniscus of photoresist developer solution thereover. Thus, the photoresist material exposed to either the meniscus or thin film of photoresist developer solution will be subjected to the development process. Consequently, the development process will not be completed for a given location on the substrate until the thin film of photoresist developer solution is removed from the substrate by the meniscus of rinsing fluid that follows the meniscus of photoresist developer solution. Thus, for a given relative velocity between the substrate and the meniscus of photoresist developer solution, the residence time of the photoresist developer solution on the substrate is determined by the separation distance between the meniscus of photoresist developer solution and the following meniscus of rinsing fluid.

In either of the above-described embodiments for controlling the photoresist developer residence time on the substrate, traversal of the meniscus (or meniscus and thin film) of photoresist developer solution over the substrate can be followed by an operation for evaluating a resulting condition of the substrate. Based on the evaluation of the resulting condition of the substrate, control of the residence time of the photoresist developer solution on the substrate can be adjusted to improve a resulting condition of a subsequent substrate to be traversed beneath the meniscus of photoresist developer solution.

It should be appreciated that the proximity method of the present invention for applying the photoresist developer solution to the substrate enables achievement of very uniform developer solution residence time across the substrate. In one embodiment, the photoresist developer solution residence time at a given location on the substrate is controlled within a range extending from about 0.5 second to about 10 seconds. However, is should be appreciated that an appropriate photoresist developer residence time is dependent on the photoresist developer solution chemistry. With the precision photoresist developer residence time control afforded by the present invention, it is possible to use higher concentrations of active agents in the developer solution. For example, if the photoresist developer solution includes a higher concentration of active agents, the photoresist developer residence time can be controlled to be shorter. Conversely, if the photoresist developer solution includes a lower concentration of active agents, the photoresist developer residence time can be controlled to be longer.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. An apparatus for developing an exposed photoresist material on a substrate, comprising:
    a first proximity head configured to define a developing meniscus of a photoresist developer solution on the substrate, the developing meniscus to be defined between a bottom of the first proximity head and the substrate, and wherein the first proximity head is configured to leave a film of the photoresist developer solution on the substrate following traversal of the first proximity head and developing meniscus over the substrate;
    a second proximity head configured to define a rinsing meniscus on the substrate and remove the rinsing meniscus from the substrate, the second proximity head positioned to follow the first proximity head relative to a traversal direction of the first and second proximity heads over the substrate such that the film of photoresist developer solution is removed from the substrate in conjunction with removal of the rinsing meniscus from the substrate; and
    a proximity head positioning device defined to adjustably control a separation distance between the first proximity head and the second proximity head so as to control a residence time for the film of photoresist developer solution on the substrate.

2. An apparatus for developing an exposed photoresist material on a substrate as recited in claim 1, further comprising:
    a conveyance device defined to transport the substrate beneath the first and second proximity heads.

3. An apparatus for developing an exposed photoresist material on a substrate as recited in claim 1, wherein the first proximity head includes a photoresist developer solution delivery channel and vacuum channel to support definition and confinement of the meniscus of the photoresist developer solution on the substrate.

4. An apparatus for developing an exposed photoresist material on a substrate as recited in claim 1, wherein the second proximity head includes a rinsing fluid delivery channel, a vacuum channel, and a drying fluid delivery channel to support rinsing and drying of the substrate.

5. A system for developing an exposed photoresist material on a substrate, comprising:
    a first proximity head configured to define a developing meniscus of a photoresist developer solution on the substrate, wherein the first proximity head is configured to leave a film of photoresist developer solution on the substrate following traversal of the first proximity head and developing meniscus over the substrate;
    a second proximity head defined to remove the film of photoresist developer solution from the substrate and rinse and dry the substrate, the second proximity head positioned to follow the first proximity head relative to a traversal direction of the first and second proximity heads over the substrate;
    a proximity head positioning device defined to adjustably control a separation distance between the first and second proximity heads, wherein the separation distance and a traversal velocity of the first and second proximity heads over the substrate set a residence time for the film of photoresist developer solution on the substrate; and
    a proximity head positioning device controller defined to control the separation distance between the first and second proximity heads to establish a desired photoresist developer solution residence time on the substrate.

6. A system for developing an exposed photoresist material on a substrate as recited in claim 5, further comprising:
    a substrate examination device configured to characterize a condition of the substrate following traversal of the substrate beneath the first and second proximity heads; and
    a computing system defined to receive characterization data from the substrate examination device.

7. A system for developing an exposed photoresist material on a substrate as recited in claim 6, wherein the computing system is defined to provide instructions to the proximity head positioning device controller regarding the separation distance that is to be maintained between the first and second proximity heads, the instructions being based on the characterization data received from the substrate examination device, the proximity head positioning device controller being defined to automatically adjust the proximity head positioning device to achieve the separation distance between the first and second proximity heads as instructed by the computing system.

8. A system for developing an exposed photoresist material on a substrate as recited in claim 5, further comprising:
    a photoresist developer solution delivery controller defined to regulate a flow rate of the photoresist developer solution to the first proximity head based on instructions received from the computing system, the instructions received from the computing system being based on the characterization data received from the substrate examination device.

9. A system for developing an exposed photoresist material on a substrate as recited in claim 5, further comprising:
    a rinsing fluid delivery controller defined to regulate a flow rate of the rinsing fluid to the second proximity head based on instructions received from the computing system, the instructions received from the computing system being based on the characterization data received from the substrate examination device.

* * * * *